(12) United States Patent
Kazumi et al.

(10) Patent No.: US 6,793,768 B2
(45) Date of Patent: Sep. 21, 2004

(54) PLASMA-ASSISTED PROCESSING APPARATUS

(75) Inventors: Hideyuki Kazumi, Hitachinaka (JP); Manabu Edamura, Niihari-gun (JP); Kazuyuki Ikenaga, Niihari-gun (JP); Atsushi Ootake, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 150 days.

(21) Appl. No.: 10/061,168

(22) Filed: Feb. 4, 2002

(65) Prior Publication Data

US 2002/0104482 A1 Aug. 8, 2002

(30) Foreign Application Priority Data

Feb. 7, 2001 (JP) ........................................ 2001-031283

(51) Int. Cl.[7] .......................... C23C 16/00; H01L 21/00
(52) U.S. Cl. ............................ 156/345.48; 118/723 AN
(58) Field of Search ........................ 118/723 I, 723 IR, 118/723 AN; 156/345.48, 345.49

(56) References Cited

U.S. PATENT DOCUMENTS

| | | | | |
|---|---|---|---|---|
| 5,226,967 A | * | 7/1993 | Chen et al. ............... | 118/723 I |
| 5,698,036 A | * | 12/1997 | Ishii et al. ............ | 118/723 MW |
| 5,795,429 A | * | 8/1998 | Ishii et al. ............. | 156/345.48 |
| 5,897,712 A | * | 4/1999 | Hanawa et al. ................ | 216/68 |
| 6,280,563 B1 | * | 8/2001 | Baldwin et al. ........ | 156/345.48 |
| 6,311,638 B1 | * | 11/2001 | Ishii et al. ........... | 118/723 MW |
| 6,388,632 B1 | * | 5/2002 | Murakawa et al. ......... | 343/770 |

* cited by examiner

Primary Examiner—Luz Alejandro-Mulero
(74) Attorney, Agent, or Firm—Antonelli, Terry, Stout & Kraus, LLP

(57) ABSTRACT

A plasma-assisted processing apparatus has a vacuum vessel defining a processing chamber, a gas supply line for carrying gases into the processing chamber, a workpiece support disposed in the processing chamber and serving as an electrode, a disk antenna for radiating a high-frequency wave having a frequency in the VHF or the UHF band into the processing chamber, a high-frequency waveguide for guiding a high-frequency wave to the disk antenna, and a window made of a dielectric material isolating the disk antenna from the processing chamber. A conductive ring is disposed between the disk antenna and the window such that one surface thereof is in contact with a peripheral part of the disk antenna.

2 Claims, 13 Drawing Sheets

ELECTRIC FIELD

ABSORBED POWER

UHF PLASMA-ASSISTED PROCESSING APPARATUS

DEPENDENCE OF ELECTRIC FIELD STRENGTH ON THE THICKNESS OF THE VOID

ELECTRIC FIELD STRENGTH

UHF PLASMA-ASSISTED PROCESSING APPARATUS

ELECTRIC FIELD

ABSORBED POWER

PLASMA-ASSISTED PROCESSING APPARATUS

BACKGROUND OF THE INVENTION

The present invention relates to a plasma-assisted processing apparatus; and, more particularly, the invention relates to a plasma-assisted processing apparatus capable of producing a highly dense, highly uniform plasma under different conditions defined by various parameters, including the types of gases, the pressure of gases and high-frequency power, which are variable in wide ranges, and of satisfactorily processing a workpiece by use of a plasma-assisted process.

Miniaturization of the components of ultralarge-scale integrated circuits (ULSI circuits) has made rapid progress in recent years, and ULSI circuits of minute structure having a minimum feature length on the order of 0.13 μm have been developed. Semiconductor wafers having a large diameter on the order of 300 mm have been used for forming such ULSI circuits thereon. There has been a need for processing apparatuses that are capable of accurately etching workpieces to form DRAMs and flash memories as well as system LSIs, and of processing large-diameter semiconductor wafers.

To meet such a requirement, a plasma-assisted process that is not only capable of highly uniformly processing a large area, but also of having an advanced control characteristic, is necessary. A plasma-assisted processing apparatus must be provided with a plasma-assisted processing unit that is capable of fine processing, and standards for dimensions have become strict. For example, a plasma-assisted etching process must prevent the occurrence of a shape anomaly called a "notch" resulting from the accumulation of positive charges in the bottom of a minute pattern. Negative gases used for etching, such as $Cl_2$, $BCl_3$, $SF_6$ and such, produce negative ions during an etching process. Those negative ions have a function to neutralize positive charges accumulated in the bottom of a minute pattern. Since negative ions are produced more easily at lower electron temperatures, it is desired to realize a plasma having a low electron temperature. Such a plasma of low electron temperature can be produced by a plasma-assisted processing apparatus using high-frequency power at a frequency in the VHF or the UHF band.

In a plasma-assisted processing apparatus, a plasma is produced through the capacitive coupling of an antenna or a counter electrode, when the frequency of high-frequency power applied to the plasma-assisted processing apparatus is 10 MHz or below. The wavelength of the high-frequency power is far smaller than the diameter of the antenna, and any potential distribution is not formed on the antenna. Therefore, a uniform plasma is produced in front of the antenna.

When the frequency of the high-frequency power applied to the plasma-assisted processing apparatus is not lower than the VHF band, the wavelength of the high-frequency power is short, but is long as compared with the diameter of the antenna. Consequently, the uniformity of the plasma produced in front of the antenna is unsatisfactory.

FIG. 12 is a schematic sectional view of a known plasma-assisted processing apparatus using high-frequency power at a frequency in the VHF or the UHF band.

In FIG. 12 the apparatus includes a case 50, a vacuum vessel 51, a processing chamber 52, a workpiece support (electrode) 53 for supporting a workpiece (wafer) 54, a gas supply passage 55, an exhaust passage 56, a first high-frequency power source 57, a high-frequency waveguide 58, a matching device 59, a shield 60, a disk antenna 61, a dielectric material 62, magnetic field creating parts 63, a window 64, a gas-diffusing plate 65 and a second high-frequency power source 66.

The vacuum vessel 51 is disposed in the case 50. The vacuum vessel 51 defines the processing chamber 52. The exhaust passage 56 is connected for evacuation to a lower part of the vacuum vessel 51. The workpiece support 53 supporting the workpiece 54 is located in the processing chamber 52. A large open end of the vacuum vessel 51 is closed hermetically by the window 64 and the gas-diffusing plate 65. The gas supply passage 55 is connected to the gas-diffusing plate 65 to supply gases through the gas-diffusing plate 65 into the processing chamber 52. The disk antenna 61 is placed on the window 64. The disk antenna 61 and the dielectric material 62 are covered with the shield 60. The high-frequency waveguide 58, which penetrates the shield 60, extends through a through hole formed in the case 50 to connect the disk antenna 61 to the external first high-frequency power source 57. The high-frequency waveguide 58 has one end joined to the disk antenna 61 and the other end connected through the matching device 59 to the first high-frequency power source 57. The high-frequency waveguide 58 guides high-frequency power at a frequency in the UHF band (or the VHF band) generated by the first high-frequency power source 57 to the disk antenna 61. The magnetic field creating parts 63 are disposed in the case 50 to create a magnetic field in the processing chamber 52. The second high-frequency power source 66 is connected to the workpiece support 53 to supply high-frequency power at a frequency in the UHF band (or the VHF band) to the workpiece support 53.

When processing the workpiece 54 in the plasma-assisted processing apparatus, gases are supplied through the gas supply passage 55 into the processing chamber 52, the first high-frequency power source 57 applies high-frequency power to the disk antenna 61, the second high-frequency power source 66 applies high-frequency power to the workpiece support 53, and the magnetic field creating parts 63 create a magnetic field in the processing chamber 52. Thus, a plasma is produced in the processing chamber 52. The plasma acts on the surface of the workpiece 54 for plasma-assisted processing.

Since the frequency of the high-frequency power is in the UHF band (or the VHF band), the high-frequency wave carrying the high-frequency power assumes the aspect of an electromagnetic wave. This high-frequency wave propagates only on the boundary region of the plasma and is absorbed. The high-frequency wave is not radiated simply from the disk antenna 61, but also forms a standing wave in a sheath region on the boundary of the plasma and in the high-frequency waveguide 58. The strength distribution of an electric field is dependent on the size and shape of the boundary region of the plasma. To create a high-frequency electric field of a desired strength distribution, such as a flat distribution extending in the direction of the length (diameter) of the workpiece 54, notice must be taken not only of the electric field created in a region under the disk antenna 61, but also of an electric field created around the workpiece 54. This is because, as the high-frequency electric field created around the workpiece 54 tends to enlarge, the high-frequency power is concentrated on the region in which the plasma is produced after the plasma has been produced in the region around the workpiece 54; and, consequently, the density of the plasma around the workpiece 54 increases progressively.

FIGS. 13A to 13D are views and graphs, respectively, which assist in explaining the creation of such a high-frequency electric field. FIG. 13A is a fragmentary sectional view of the plasma-assisted processing apparatus; FIG. 13B is a diagrammatic view showing the strength distribution of an electric field; FIG. 13C is a graph showing the strength distribution of an electric field with respect to a direction along the diameter of the disk antenna 61; and FIG. 13D is a graph showing the variation of power absorption with position with respect to the diameter of the disk antenna 61. In this example, the frequency f of the high-frequency power is 450 MHz, and the window 64 is formed of quartz (specific dielectric constant: 3.5).

In FIG. 13A, there is a sheath region 67, and the other parts like or corresponding to those shown in FIG. 12 are denoted by the same reference characters. In FIG. 13C, the distance (m) from the center of the workpiece 54 is measured on the horizontal axis, and the ratio of the electric field strength $E_{edge}$ at an optional part of the workpiece 54 to the electric field strength $E_{center}$ at a central part of the workpiece 54 is measured on the vertical axis. In FIG. 13D, the distance (m) from the center of the workpiece 54 is measured on the horizontal axis, and the power of an electromagnetic wave absorbed by the plasma (absorbed power) is measured on the vertical axis.

As shown in FIG. 13B, a high-frequency wave having a frequency in the UHF band propagates through the window 64 and the sheath region (boundary region of the plasma) 67. As shown in FIG. 13C, a strength distribution curve, indicating the strength distribution of the electric field created right below the window 64, has a node at a part corresponding to the distance 110 mm from the center of the workpiece 54 ($TM_{01}$ mode), and a part of the electric field around a peripheral part of the workpiece 54 has an electric field strength $E_{edge}$. The high-frequency wave having a frequency in the UHF band is concentrated on a part where the plasma density increases, further enhancing the concentration of the high-frequency wave of the frequency in the UHF band on the same part. Consequently, as shown in FIG. 13D, the absorbed power of the high-frequency wave and the plasma density distribution change when the high-frequency power (density) is changed.

In a known plasma-assisted processing apparatus using a high-frequency wave having a frequency in the VHF or the UHF band, the uniformity of the plasma density distribution in front of the antenna is disturbed and the plasma density distribution changes when the high-frequency power (density) is changed.

There are some known plasma-assisted processing apparatuses; using a high-frequency wave having a frequency in the VHF or the UHF band, that are capable of producing an improved plasma. A first known plasma-assisted processing apparatus, as disclosed in Japanese Patent Laid-open No. 2000-195843, is provided with a disk-shaped counter electrode disposed opposite to a wafer, i.e., a workpiece, with a dielectric material being disposed between the counter electrode and the wafer. A second known plasma-assisted processing apparatus, as disclosed in Japanese Patent Laid-open No. 7-307200, is provided with a radial antenna structure for radiating a high-frequency wave, formed by alternately arranging a plurality of antenna elements radially extending from the center of the antenna and a plurality of antenna elements extending from the periphery toward the center of the antenna. A third known plasma-assisted processing apparatus, as disclosed in Japanese Patent Laid-open No. 10-12396, is provided with an antenna structure including an inner antenna conductor and an outer antenna conductor, having a length different from the inner antenna, disposed at different levels, respectively, to form a resonance structure for producing a uniform plasma. A fourth known plasma-assisted processing apparatus, as disclosed in Japanese Patent laid-open no. 2000-195843, is provided with a disk-shaped electrode (antenna) disposed opposite to a wafer, i.e., a workpiece, and provided with an annular groove as a plasma trap to produce a uniform plasma and to control the plasma density distribution on the wafer.

The first known plasma-assisted processing apparatus is intended to moderate the potential distribution of the high-frequency wave on the counter electrode by disposing the dielectric material between the antenna and the counter electrode. However, the production of a plasma by an electromagnetic wave that propagates along the surface of the counter electrode is dominant because the plasma is produced by capacitive coupling dependent on the potential distribution of the high-frequency wave, and the effect on the moderation of the potential distribution of the high-frequency wave on the counter electrode is comparatively unsatisfactory.

The second known plasma-assisted processing apparatus uses a radial antenna structure, in which intervals between the antenna elements increase toward the periphery of the radial antenna structure. Therefore, the electric field strength in a region around the peripheral part of the radial antenna structure is low, and boundary conditions for the electromagnetic wave in a region in which the antennal element exists and in a region in which any antenna element does not exist are different. Therefore, the electric field strength is not fixed with respect to the circumferential direction on the radial antenna structure.

In the third known plasma-assisted processing apparatus, an intense electromagnetic wave radiated by the antenna propagates through the sheath region when a desired resonance structure is formed. Therefore, the pattern of antenna radiation is different from the pattern of the electric field in the sheath region, and, hence, the plasma density is not necessarily distributed in a uniform manner.

In the fourth known plasma-assisted processing apparatus, the plasma trap formed on the counter electrode is in a plasma-producing region. Therefore, an electromagnetic wave radiated from the counter electrode is enhanced by the plasma trap, the plasma density around the plasma trap increases, the high-density plasma produced in the region diffuses into a region around the workpiece, and a uniform plasma, which is more uniform than a plasma produced by a plasma-assisted processing apparatus not provided with any plasma trap, is produced around the workpiece. However, since the plasma flows into the annular groove serving as the plasma trap, it is difficult to produce a still more uniform plasma.

Those known plasma-assisted processing apparatuses using a high-frequency wave having a frequency in the VHF or the UHF band have difficulty in producing a uniform plasma in a region in which the workpiece is placed, and they take nothing into consideration to prevent the variation of the density of the plasma produced around the workpiece dependent on the variation of the process parameters.

SUMMARY OF THE INVENTION

The present invention has been made in view of the above-mentioned a technical background, and it is therefore an object of the present invention to provide a plasma-assisted processing apparatus that is capable of producing a highly uniform, high-density plasma around the entire workpiece by using a high-frequency wave having a frequency in the VHF or the UHF band, regardless of a variation of the process parameters.

According to the present invention, a plasma-assisted processing apparatus includes: a vacuum vessel defining a processing chamber; a gas supply line for carrying gases into the processing chamber; a workpiece support for supporting a workpiece, disposed in the processing chamber and serving as an electrode; a disk antenna for radiating a high-frequency wave having a frequency in the VHF or the UHF band into the processing chamber; a high-frequency waveguide for guiding a high-frequency wave to the disk antenna; and a window of a dielectric material isolating the disk antenna from the processing chamber; wherein a conductive ring is disposed between the disk antenna and the window, such that its end surface is in contact with a peripheral part of the disk antenna.

The conductive ring is disposed with its end surface in contact with the peripheral part of the disk antenna to generate a standing wave in a space surrounded by the conductive annular ring. Thus, the strength of a part of an electric field in the space surrounded by the conductive ring is enhanced, and the strength of a part of the electric field around the conductive ring decreases relatively. Therefore, the variation of power absorbed by the plasma, i.e., the variation of the plasma density distribution, can be suppressed even if the high-frequency power (density) varies.

A second window made of a dielectric material may be superposed on the first window, and the first window and the second window may be formed of different dielectric materials respectively having different dielectric constants, respectively. Use of such a technique enhances the standing wave in the boundary region of the plasma through the enhancement of the high-frequency standing wave in a region right under the disk antenna, and the function of the structure can be enhanced.

An antenna height adjusting means that is capable of moving the disk antenna to adjust the distance between the disk antenna and the first window, or to adjust the distance between the disk antenna and the first window and the distance between the disk antenna and the second window, may be connected to the disk antenna. Thus, the position of a node in the high-frequency standing wave right under the disk antenna can be moved along the diameter of the disk antenna, whereby the plasma density distribution can be optionally adjusted to a plasma density distribution compatible with gases and a film to be processed.

The conductive ring may be formed in an inside diameter in the range of an integral multiple of half the wavelength of the high-frequency wave propagating through the conductive ring ±10%. Thus, the high-frequency standing wave right under the disk antenna can be enhanced, and, hence, a plasma can be easily produced right under the disk antenna.

A conductive member having the shape of a rod or a cylinder having a height equal to that of the conductive ring may be disposed in a central region of a space surrounded by the conductive ring and corresponding to a central part of the disk antenna. Thus, the strength of a part of the high-frequency electric field corresponding to the central part of the disk antenna can be enhanced, whereby the processing speed at which a central part of the workpiece is processed can be increased.

A dielectric ring or cylinder having a height nearly equal to that of the conductive ring may be disposed in central region of a space surrounded by the conductive ring and corresponding to a central part of the window. Thus, the reduction of the strength of a part of the high-frequency electric field corresponding to a central part of the disk antenna can be avoided, whereby a uniform electric field can be created around the central part of the disk antenna.

The disk antenna and the high-frequency waveguide may be formed in dimensions meeting an inequality: $a/R_d \leq 0.4$ or $a/R_d \leq 0.6$, where a is the radius of the disk antenna, and $R_d$ is the effective radius of the high-frequency waveguide. Thus, the strength of a part of the high-frequency electric field around the disk antenna can be reduced, and the density of a part of the plasma around the disk antenna can be reduced, whereby a highly uniform, high-density plasma can be stably produced around the entire workpiece.

DESCRIPTION OF THE PREFERRED EMBODIMENTS

Preferred embodiments of the present invention will be described with reference to the accompanying drawings.

Figure 1:
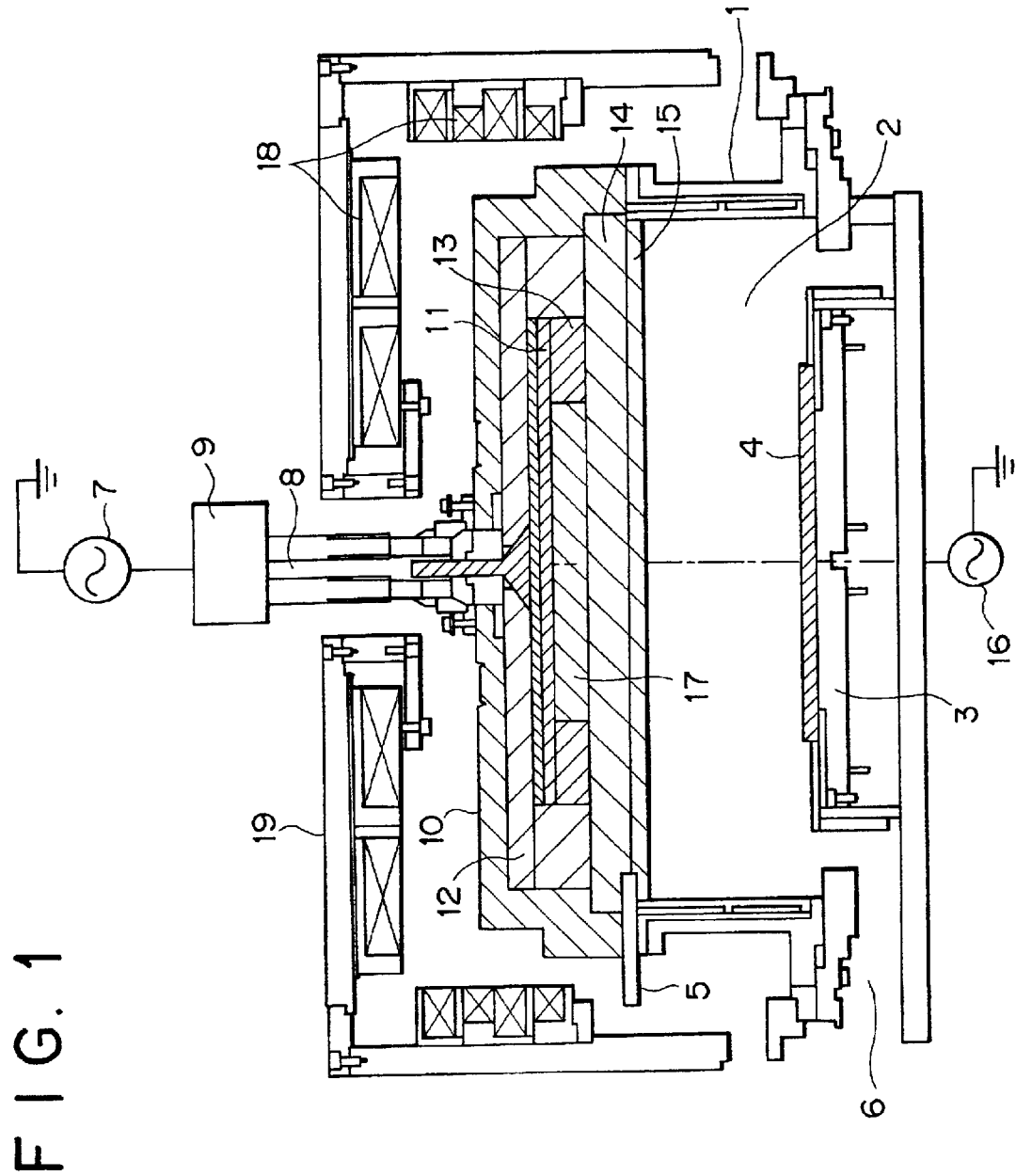
FIG. 1 is a schematic sectional view of a plasma-assisted processing apparatus representing a first embodiment according to the present invention.

Referring to FIG. 1, the plasma-assisted processing apparatus, representing a first embodiment according to the present invention, has a vacuum vessel 1, a processing chamber 2 defined by the vacuum vessel 1, a workpiece support 3 (support electrode), a workpiece 4, a gas supply passage 5, an exhaust passage 6, a first high-frequency power source 7, a high-frequency waveguide 8, a matching device 9, a shield 10, a disk antenna 11, a dielectric material 12, a conductive ring 13, a window 14, a gas-diffusing plate 15, a second high-frequency power source 16, a filler 17, magnetic field creating parts 18 and a case 19.

The vacuum vessel 1, defining the processing chamber 2, is disposed in the case 19. The exhaust passage 6 is connected for evacuation to a lower part of the vacuum vessel 1. The workpiece support 3 is located in the processing chamber 2, and the workpiece 4 is mounted on the workpiece support 3. The open upper end of the vacuum vessel 1 is closed hermetically by the window 14, and the gas-diffusing plate 15 is placed contiguously with the lower surface of the window 14. The gas supply passage 5 is connected to the gas-diffusing plate 15. Gases are supplied through the gas-diffusing plate 15 into the processing chamber 2. The disk antenna 11 is disposed on a conductive ring 13 placed on the window 14. The disk antenna 11 is surrounded by the dielectric material 12. The disk antenna 11 and the dielectric material 12 are covered with the shield 10. The conductive ring 13 has one surface in contact with a peripheral part of the disk antenna 11 and the other surface in contact with the window 14. The space surrounded by the conductive ring 13 is filled with the filler 17.

The high-frequency waveguide 8 extends through the shield 10 and the case 19 to connect the disk antenna 11 to the external first high-frequency power source 7. The high-frequency waveguide 8 has one end joined to a central part of the disk antenna 11 and the other end connected through the matching device 9 to the first high-frequency power source 7. The first high-frequency power source 7 generates a high-frequency wave having a frequency in the UHF band (or the VHF band). The high-frequency wave is applied through the high-frequency waveguide 8 to the disk antenna 11. The magnetic field creating parts 18 are disposed inside the case 19 to create a magnetic field in the processing chamber 2. The external second high-frequency power source 16 is connected to the workpiece support 3 to apply a high-frequency wave having a frequency in the UHF band (or the VHF band) to the workpiece support 3.

Figure 12:
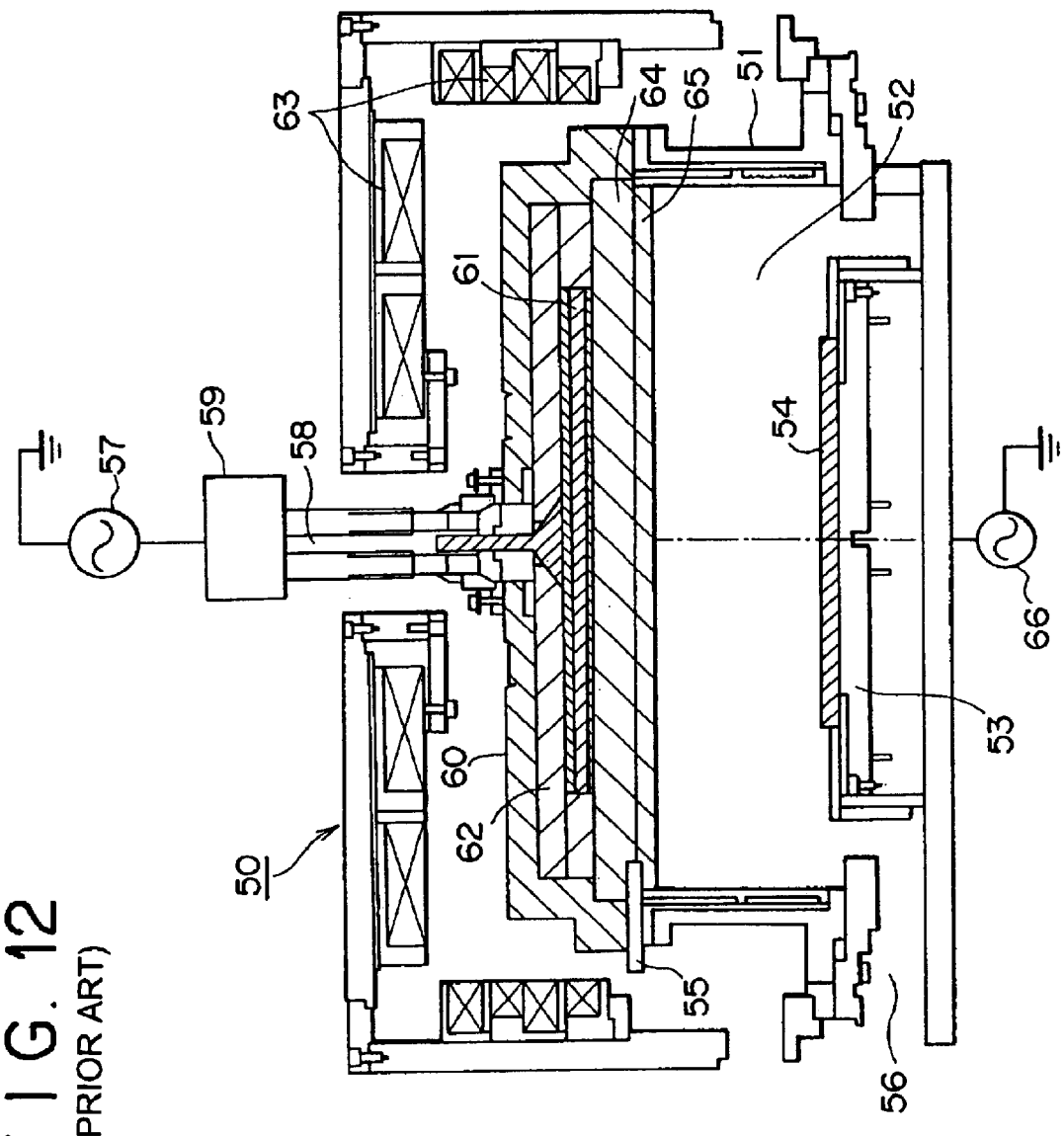
FIG. 12 is a schematic sectional view of a known plasma-assisted processing apparatus using high-frequency power at a frequency in the VHF or the UHF band.

Basic operations of the plasma-assisted processing apparatus according to the first embodiment are substantially the same as those of the known plasma-assisted processing apparatus shown in FIG. 12. Process gases are supplied through the gas supply passage 5 and the gas-diffusing plate 15 into the processing chamber 2. A high-frequency wave having a frequency in the UHF band (or the VHF band), such as 450 MHz, that is generated by the first high-frequency power source 7, is applied through the high-frequency waveguide 8 and the matching device 9 to the disk antenna 11 to create a high-frequency electric field under the disk antenna 11; and, at the same time, a high-frequency wave of a frequency in the UHF band (or the VHF band), such as 450 MHz, that is generated by the second high-frequency power source 16, is applied to the workpiece support 3, and the magnetic field creating parts 18 create a magnetic field in the processing chamber 2. Consequently, a plasma is produced in the processing chamber 2. The plasma is applied to the workpiece 4 to process the surface thereof.

Since the conductive ring 13 is disposed with one surface in contact with the peripheral part of the disk antenna 11, a high-frequency standing wave is generated in the space surrounded by the conductive ring 13 so as to enhance the strength of a part of the electric field in the space surrounded by the conductive ring 13 and to relatively reduce the strength of a part of the electric field around the conductive ring 13.

Figure 8A:
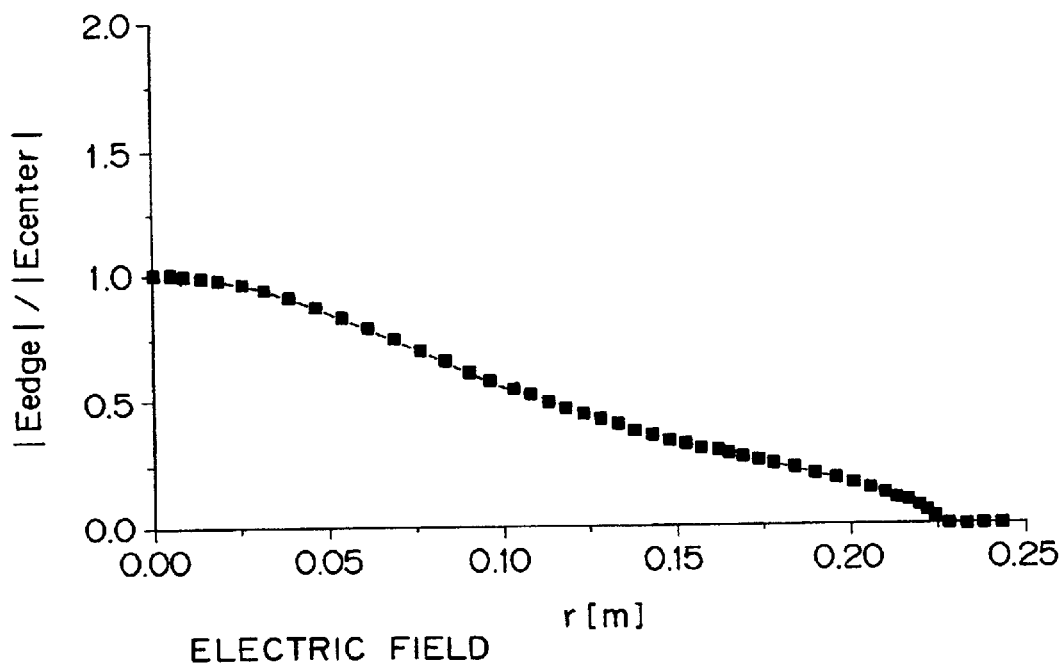
FIGS. 8A and 8B are graphs showing an electric field strength distribution and an absorbed power distribution, respectively, in the plasma-assisted processing apparatus of the first embodiment.
Figure 8B:
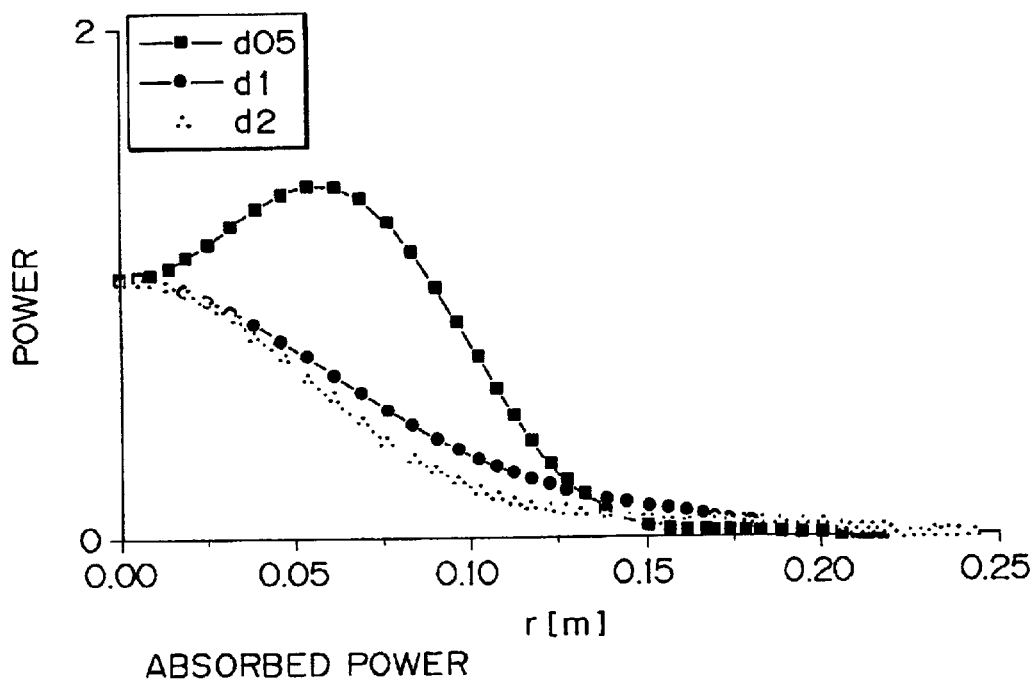

FIGS. 8A and 8B are graphs showing electric field strength distribution and absorbed power distribution, respectively, in the plasma-assisted processing apparatus in the first embodiment.

In FIG. 8A, the distance (m) from the center of the disk antenna 11 is measured on the horizontal axis, and the ratio $E_1/E_0$, where $E_0$ ($E_{center}$) is the electric field strength of a part of the electric field around the center of the disk antenna 11 and $E_1$ ($E_{edge}$) is the electric field strength of a part of the electric field around a part of the disk antenna 11 at a distance from the center of the disk antenna 11, i.e., values of $E_1$ normalized by $E_0$, is measured on the vertical axis. In FIG. 8B, the distance (m) from the center of the disk antenna 11 is measured on the horizontal axis, and absorbed power absorbed by the plasma from the high-frequency wave is measured on the vertical axis.

Figure 13B:
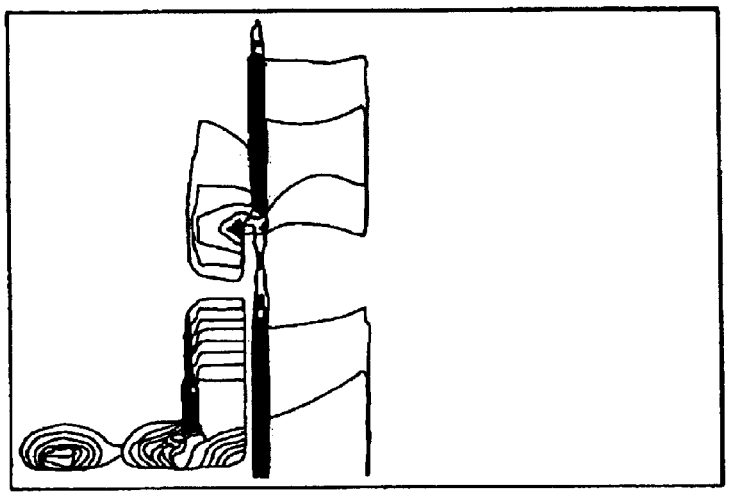
FIG. 13B is an electric field strength diagram.
Figure 13A:
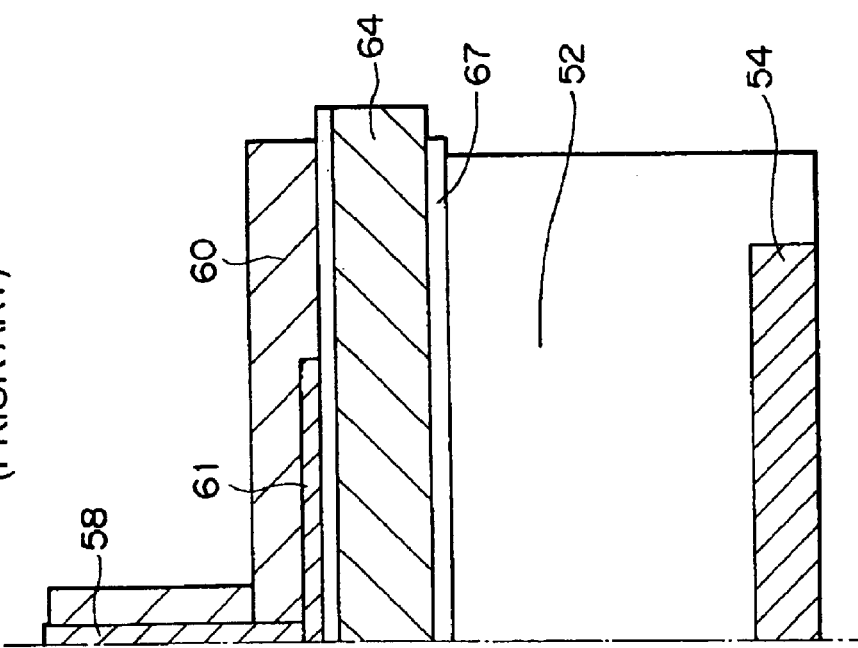
FIG. 13A is a partial sectional view of a VHF plasma-assisted processing apparatus.
Figure 13C:
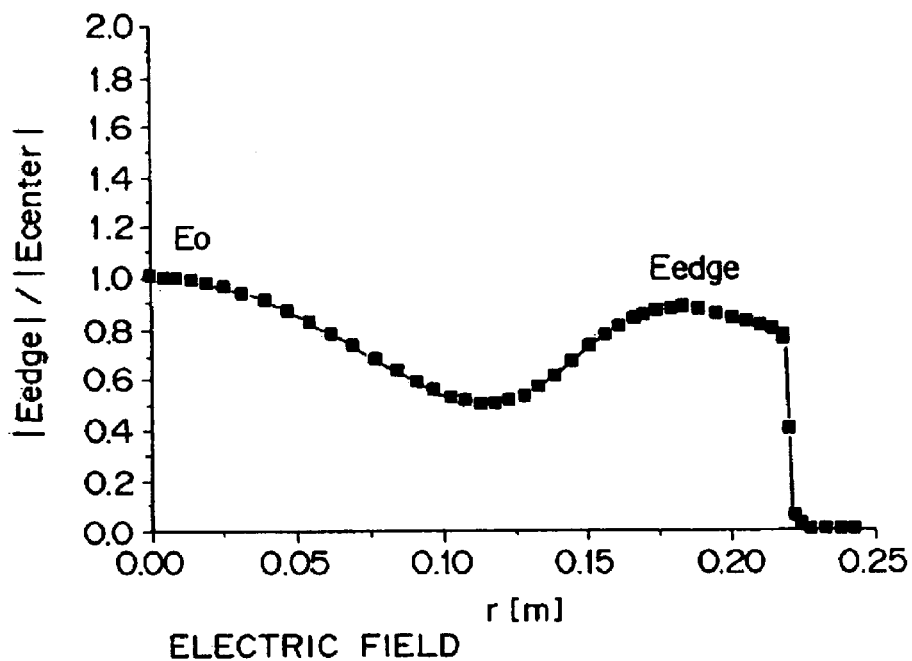
FIGS. 13C and 13D are graphs showing conditions of high-frequency electric fields and absorbed power, respectively, in the apparatus of FIG. 13A.
Figure 13D:
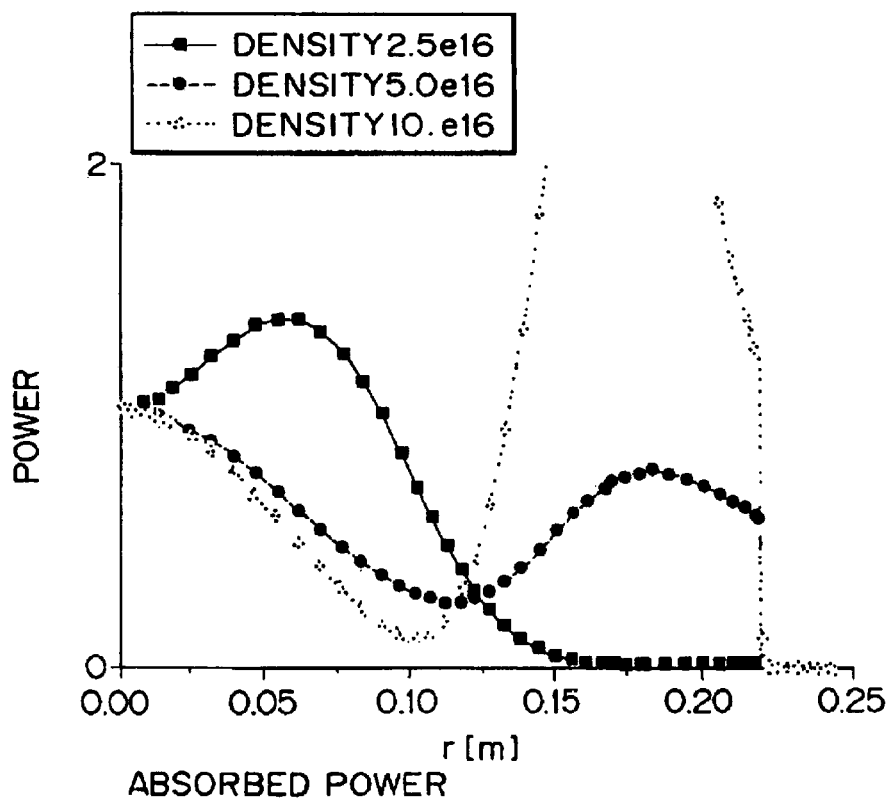

As obvious from FIG. 8A, the electric field has a maximum electric field strength around the center of the disk antenna 11, and the electric field strength decreases with distance from the center of the disk antenna 11. The electric field strength is substantially zero at the circumference of the disk antenna 11. As obvious from FIG. 8B, absorbed power is comparatively large around the center of the disk antenna 11, the decreases gradually toward the circumference of the disk antenna 11. Absorbed power is substantially zero in a region around the circumference of the disk antenna 11. Absorbed power absorbed by the part of the plasma around a peripheral part of the disk antenna 11 of the plasma-assisted processing apparatus in the first embodiment is far smaller than that shown in FIG. 13D absorbed by the part of the plasma around the disk antenna of the known plasma-assisted processing apparatus shown in FIG. 12. Therefore, the range of variation of absorbed power, i.e., the range of variation of plasma density distribution, in the plasma-assisted processing apparatus in the first embodiment is narrow even if the high-frequency power (density) changes, and so the variation of plasma density distribution dependent on process parameters can be reduced.

Figure 2:
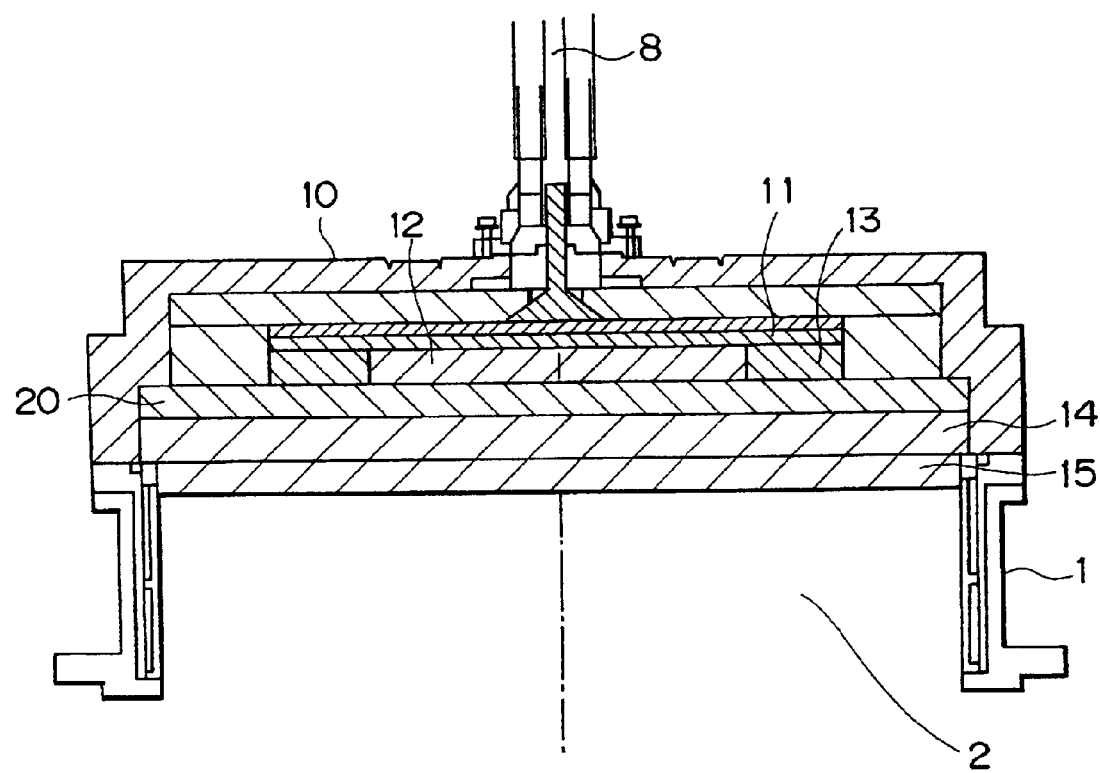
FIG. 2 is a schematic sectional view of a disk antenna and associated parts of a plasma-assisted processing apparatus representing a second embodiment according to the present invention.

FIG. 2 shows a disk antenna 11 and associated parts of a plasma-assisted processing apparatus according to a second embodiment of the present invention, in which parts like or corresponding to those of the plasma-assisted processing apparatus of the first embodiment are denoted by the same reference numerals. The plasma-assisted processing apparatus in the second embodiment is provided with a second window 20.

Referring to FIG. 2, the second window 20 is sandwiched between a window 14 and a conductive ring 13. The second window 20 is formed of a dielectric material having a dielectric constant different from that of the dielectric material forming the window 14. The plasma-assisted processing apparatus according to the second embodiment is the same in other respects as the plasma-assisted processing apparatus of the first embodiment.

A void may be provided in place of the second window 20 made of dielectric material. If a void is formed instead of providing the second window 20, the void performs two functions, i.e., a first function to create a strong electric field under the disk antenna 11 and a second function to reduce the effective dielectric constant of the window 14 as judged from the plasma side.

As mentioned above, a high-frequency wave having a frequency in the UHF band (or the VHF band) propagates through a sheath region formed on the boundary of a plasma. The specific dielectric constant $\epsilon = 1 - n_{es}e^2/\epsilon_0 m_e \omega^2 \leq 1$, where $n_{es}$ is the plasma density in the sheath region, e is the elementary electric charge, (0 is the dielectric constant of a vacuum space, $m_e$ is the mass of an electron, and $\omega$ is the angular frequency of the high-frequency wave. Thus, a three-layer structure consisting of the second window 20 ($\in=1$) of air or vacuum, the window 14 of quartz ($\in=3.5$) and the sheath region ($\in<1$) is formed between the disk antenna 11 and the boundary of the plasma. This three-layer structure enhances the strength of a high-frequency standing wave generated right under the disk antenna 11, while the strength of a standing wave on the boundary of the plasma is enhanced and the plasma density of a part of the plasma under the disk antenna 11 can be increased.

In this state, the wavelength λ of the high-frequency wave, in the space that is surrounded by the conductive ring 13 and is filled up with a dielectric material 12, is expressed by: $\lambda = \lambda_0/\in_r^{1/2}$, where λ0 is the wavelength of the high-frequency wave in a vacuum and $\in r$ is the dielectric constant of the dielectric material 12. The dielectric constant $\in$ of the combination of the windows 14 and 20 is expressed by: $\in = \in_{r1}^{1/2} \times \{d_1/(\in_{r1}^{1/2}d_1 + \in_{r2}^{1/2}d_2)\} \times \in_{r1}$, where $d_1$ is the thickness of the window 14, $\in_{r1}$ is the dielectric constant of the window 14, $d_2$ is the thickness of the void or the second window 20, and $\in_{r2}$ is the dielectric constant of the void or the second window 20.

Figure 9B:
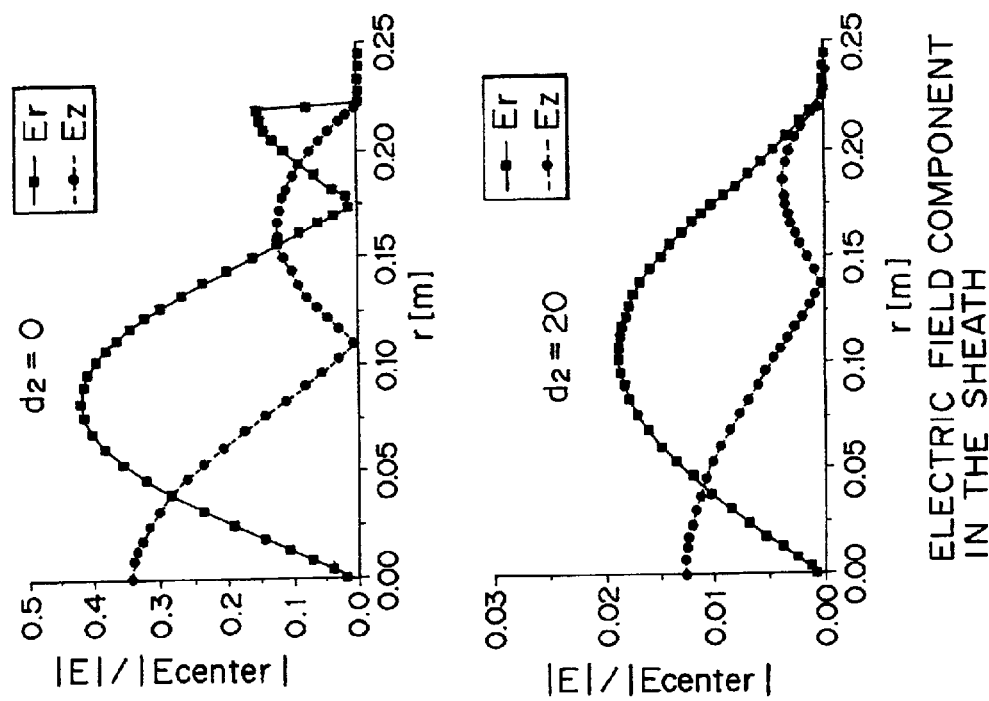
FIG. 9A is a sectional view and FIGS. 9B and 9C are graphs illustrating electric field strength distribution and absorbed power distribution in the plasma-assisted processing apparatus representing the second embodiment.
Figure 9A:
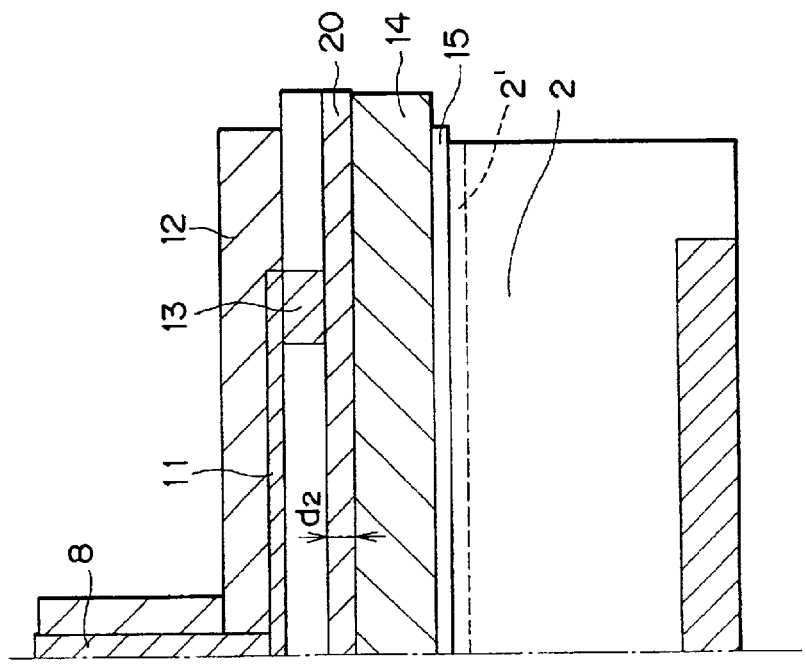
Figure 9C:
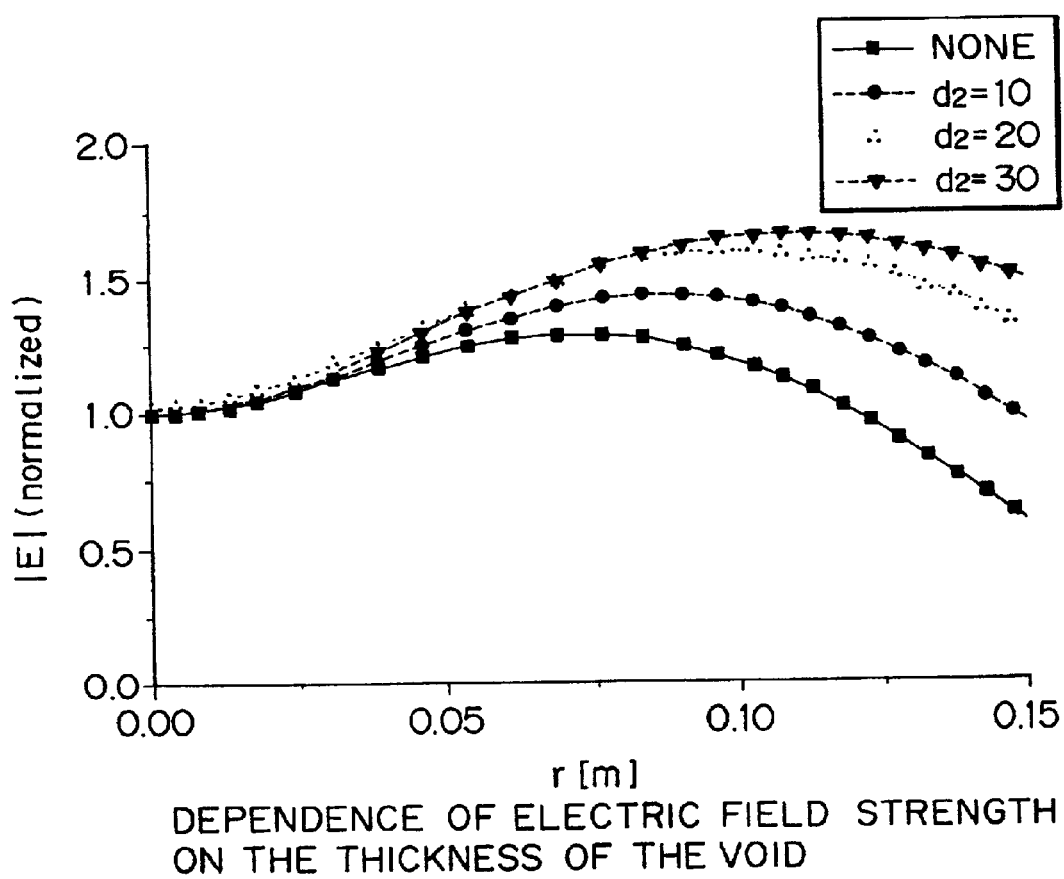

FIG. 9A is a sectional view and FIGS. 9B and 9C are graphs illustrating the condition of the electric field created in the plasma-assisted processing apparatus of the second embodiment. FIG. 9A is a fragmentary, schematic sectional view of the plasma-assisted processing apparatus; FIG. 9B is a view illustrating the condition of the electric field in the sheath region, dependent on the thickness $d_2$ of the void or the second window 20; and FIG. 9C is a graph showing the variation of electric field strength dependent on the thickness $d_2$ of the void or the second window 20 with distance along the diameter of the disk antenna 11.

In FIG. 9A, the sheath region is indicated at 2', and parts like or corresponding to those shown in FIG. 2 are denoted by the same reference numerals.

In FIG. 9B, the distance (m) from the center of the disk antenna 11 is measured on the horizontal axis, and the ratio $|E|/|E_{center}|$, where $|E_{center}|$ is the electric field strength of a part of the electric field around the center of the disk antenna 11 and $|E|$ is the electric field strength of a part of the electric field around a part of the disk antenna 11 at a distance from the center of the disk antenna 11, is measured on the vertical axis, wherein $E_r$ is a component of the electric field in the direction of diameter and $E_z$ is a component of the electric field in the direction of height. In FIG. 9B, an upper graph shows the electric field strength distribution when $d_2=0$, i.e., when the plasma-assisted processing apparatus does not have a void or the second window, and a lower graph shows the electric field strength distribution when $d_2=20$, i.e., when the plasma-assisted processing apparatus has a second window 20 which is 20 mm in thickness.

In FIG. 9C, the distance (m) from the center of the disk antenna 11 is measured on the horizontal axis, and $|E|$ (normalized), i.e., values of electric field strength $E_1$ ($E_{edge}$) at parts at distances from the center of the disk antenna 11 normalized by the electric field strength $E_0$ at the center of the disk antenna 11, is measured on the vertical axis. In FIG. 9C, the curves indicate distributions of $|E|$ for cases when the plasma-assisted processing apparatus does not have a void or the second window ($d_2=0$), and where the thickness of the void or the second window 20 is 10 mm ($d_2=20$), 20 mm ($d_2=20$) and 30 mm ($d_2=30$), respectively.

The components Er and Ez shown in FIG. 9B are dependent on $J_1(\beta_r)$ and $J_0(\beta_r)$, respectively, where β is the wavelength in the plasma, $J_0$ is the zero-order Bessel function and $J_1$ is the first-order Bessel function, and are the same as the $TM_{01}$ mode. When the frequency of the high-frequency wave is 450 MHz, the quarter wavelength of the high-frequency wave in a vacuum is 166 mm and that of the same in quartz is 88 mm. In this case, as shown in FIG. 9B, the node of the component $E_z$ shifts outward as the thickness $d_2$ of the void or the second window 20 increases and the effective wavelength of the high-frequency wave increases. For example, suppose that the frequency of the high-frequency wave is 450 MHz and the thickness $d_2$ of the second window 20 is 35 mm. While the electric field strength at a part where r=150 mm is low when the plasma-assisted processing apparatus is provided with neither the void nor the second window 20 ($d_2=0$), the $|E|$ (normalized) remains comparatively constant when the plasma-assisted processing apparatus is provided with the second window 20 of $d_2 \geq 10$ mm, as shown in FIG. 9C.

In the foregoing examples, the respective specific dielectric constants $\in_{r1}$ and $\in_{r2}$ of the window 14 and the second window 20 meet an inequality: $\in_{r1} > \in_{r2}$. However, this relation between the specific dielectric constants $\in_{r1}$ and $\in_{r2}$ is dependent on the frequency of the high-frequency wave being used and the respective specific dielectric constants $\in_{r1}$ and $\in_{r2}$ of the window 14 and the second window 20. Therefore, this relation is generalized as follows.

The specific dielectric constants $\in_{r1}$ and $\in_{r2}$ of the window 14 and the second window 20 and the thickness $d_2$ of the second window 20 are expressed by a general expression using, as parameters, the wavelength of the high-frequency wave toe be used and the radius R of the workpiece 4 to be processed. The proper radius R of the workpiece 4 may be about ¼ of the effective wavelength of the high-frequency wave in the sheath region 2'.

$$\{1-(1/10)\}R > (\lambda_0/4/\in_{r1}^{1/2}) \times \{\in_{r1}^{1/2} \times d_1/(\in_{r1}^{1/2}d_1 + \in_{r2}^{1/2}d_2)\} < \{1+(1/10)\}R$$

For example, to produce a uniform plasma in a region of 300 mm in diameter by using a high-frequency wave having a frequency in the VHF band with a wavelength longer than those of high-frequency waves in the UHF band and the window 14 of quartz having a specific dielectric constant of 3.5, the second window 20 may be formed of alumina having a large specific dielectric constant of 9.6.

Figure 3:
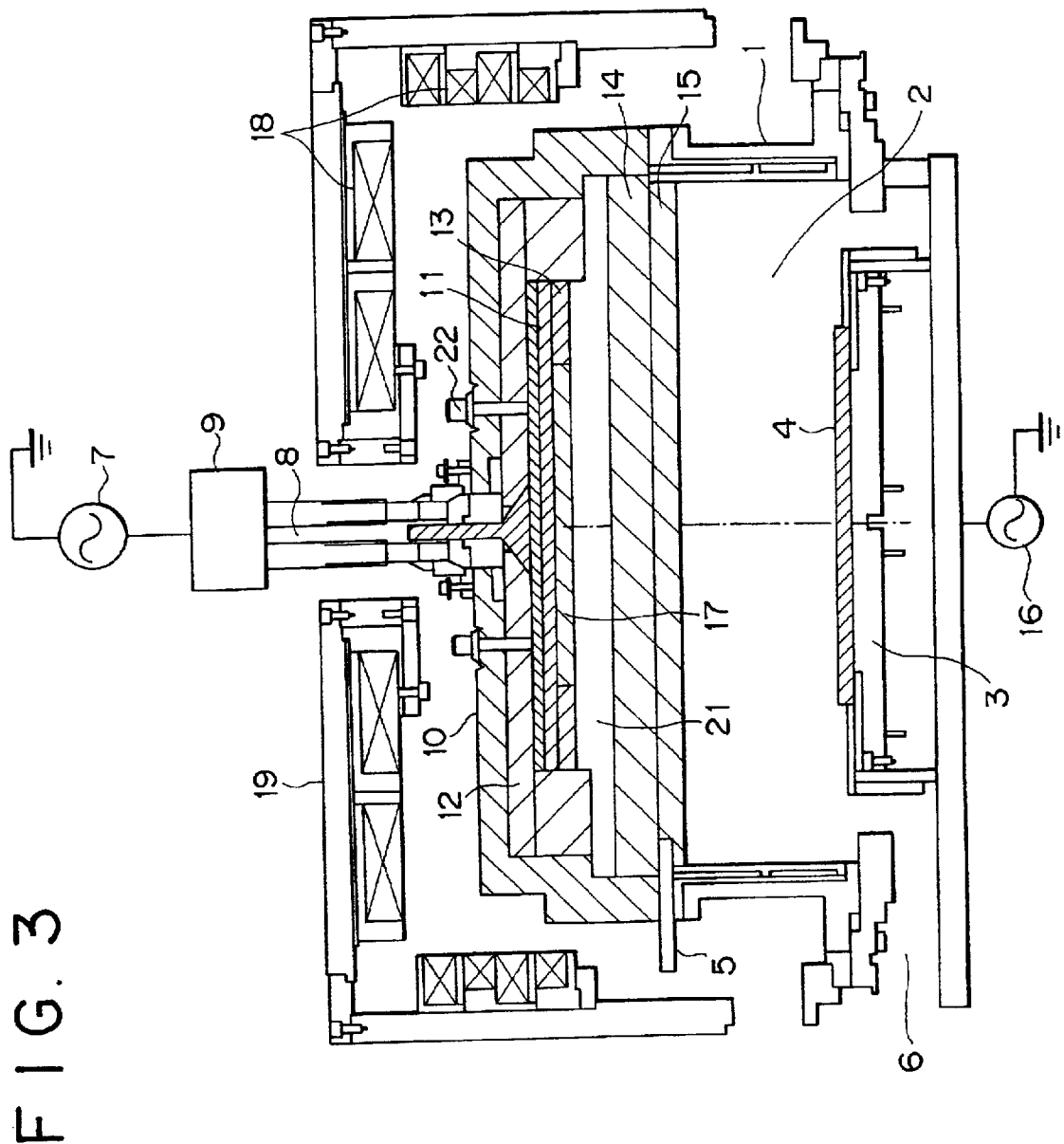
FIG. 3 is a schematic sectional view of a plasma-assisted processing apparatus representing a third embodiment according to the present invention.

FIG. 3 is a schematic sectional view of an essential part including a disk antenna 11 of a plasma-assisted processing apparatus according to a third embodiment of the present invention, in which parts like or corresponding to those shown in FIG. 1 are denoted by the same reference numerals. Shown in FIG. 3 are a void 21 and antenna height adjusting members 22.

The plasma-assisted processing apparatus in the third embodiment has a void 21 formed between a window 14 and a conductive ring 13, which are the same as those of the plasma-assisted processing apparatus of the first embodiment. The antenna height adjusting members 22 are extended through a shield 10 and are engaged with a disk antenna 11. The plasma-assisted processing apparatus of the third embodiment is identical in other respects with the plasma-assisted processing apparatus of the first embodiment.

The plasma-assisted processing apparatus of the third embodiment is provided with antenna height adjusting members 22 screwed through the shield 10. The antenna height adjusting members 22 are turned to move the disk antenna 11 vertically. Thus, the height of the disk antenna 11 and the conductive ring 13 from the window 14 can be changed to form a void 21 having a desired thickness. Thus, the thickness of the void 21 is adjusted by turning the antenna height adjusting members 22 to move the disk antenna 11.

As mentioned above in connection with the description of the second embodiment, the effective dielectric constant of the window 14, as judged from the plasma side, decreases with an increase in the thickness of the void 21; and, consequently, a node in the electric field strength distribution of the high-frequency electric field created on the boundary of a plasma shifts toward the, circumference. Therefore, the plasma density of a peripheral part of a plasma can be increased by shifting the disk antenna 11 to increase the thickness of the gap 21, and it can be decreased or should have a projected distribution in the direction of diameter by shifting the disk antenna 11 to decrease the thickness of the gap 21.

The function of an external magnetic field B created by magnetic field creating parts 18 will be described.

The density p of power supplied to the plasma by the high-frequency wave, which will be called "absorbed power", is expressed by $p=\sigma EE^*$, where $\sigma$ is conductivity, and $E^*$ is the conjugate complex vector of E, and $p \sim |E|^2 + \alpha |E \times \beta|$. A high-frequency wave having a frequency in the UHF band propagates in the $TM_{01}$ mode and does not have any angular component θ when expressed on a cylindrical coordinate system, and, hence, $E=(E_r, 0, E_z)$. When the external magnetic field B is expressed by $B=(B_r, 0, B_z)$ and the plasma density in a central part (r=0) can be increased by using a magnetic field strength distribution having a high $B_r$, and the plasma density in a middle part can be increased by using a magnetic field strength distribution having a high $B_z$ at a peak of $E_r$.

In the plasma-assisted processing apparatus of the third embodiment, the position of the disk antenna 11 is adjusted by the antenna height adjusting members 22 so that a desired electric field strength distribution can be achieved. A convex, flat or concave plasma density distribution can be optionally achieved by adjusting intensity and field strength distribution of the external magnetic field B to change $|E \times B|$. These adjusting functions are capable of realizing plasma density distributions respectively suitable for various types of gases and various types of films.

Figure 4:
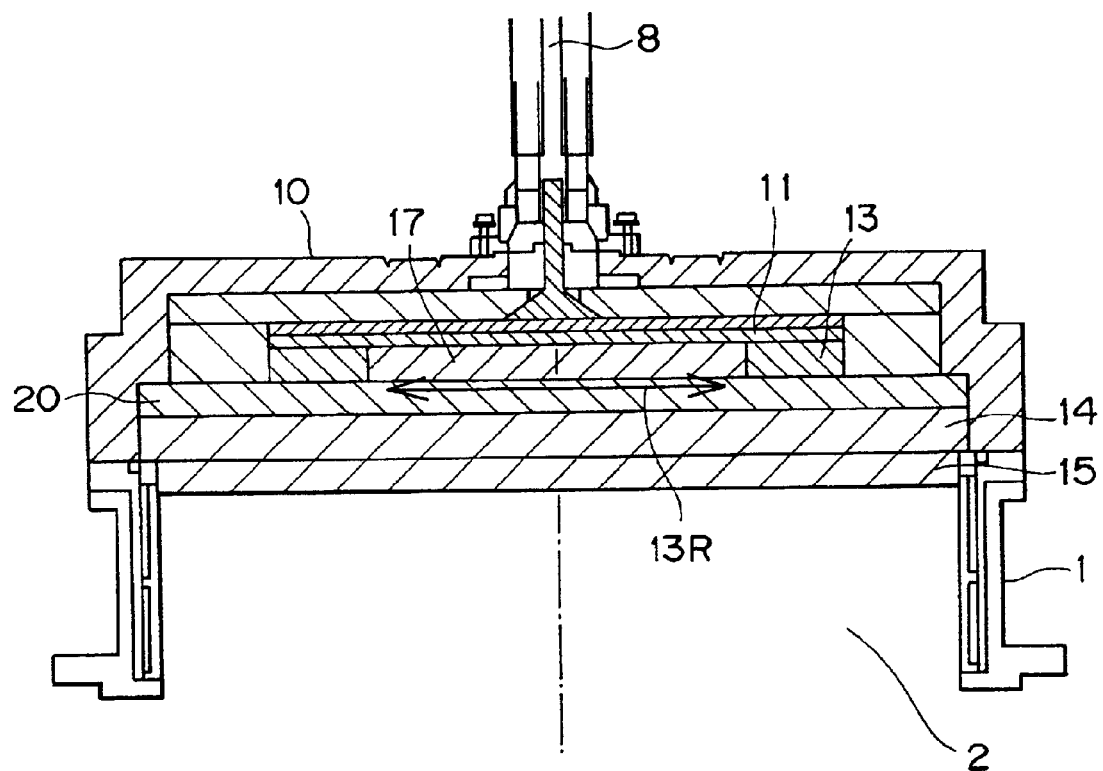
FIG. 4 is a schematic sectional view of a disk antenna and associated parts of a plasma-assisted processing apparatus representing a fourth embodiment according to the present invention.

FIG. 4 is a schematic sectional view of an essential part including a disk antenna 11 of a plasma-assisted processing apparatus in a fourth embodiment according to the present invention, in which parts like or corresponding to those shown in FIG. 2 are denoted by the same reference characters. In FIG. 4, indicated at 13R is the inside diameter of a conductive ring 13.

The inside diameter 13R of the conductive ring 13 of the plasma-assisted processing apparatus in the fourth embodiment is about equal to an integral multiple of half the wavelength of a high-frequency wave in a filler 17. The plasma-assisted processing apparatus in the fourth embodiment is identical in other respects with the plasma-assisted processing apparatus in the second embodiment.

Since the inside diameter 13R of the conductive ring 13 of the plasma-assisted processing apparatus in the fourth embodiment is about equal to an integral multiple of half the wavelength of the high-frequency wave in the filler 17, the plasma density of a part of a plasma in a region under the disk antenna 11 can be made greater than part of the plasma in other regions by making the strength of a high-frequency standing wave formed in a region surrounded by the conductive ring 13 greater than that of a high-frequency standing wave formed in other regions.

Figure 5:
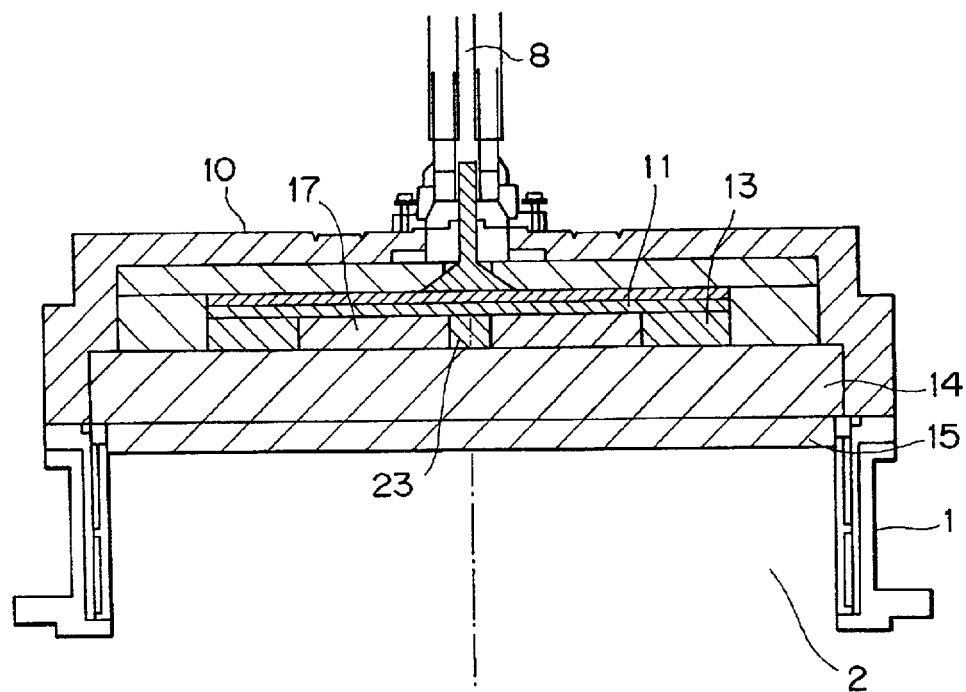
FIG. 5 is a schematic sectional view of a disk antenna and associated parts of a plasma-assisted processing apparatus representing a fifth embodiment according to the present invention.

FIG. 5 is a schematic sectional view of an essential part including a disk antenna 11 of a plasma-assisted processing apparatus according to a fifth embodiment of the present invention, in which parts like or corresponding to those shown in FIG. 1 are denoted by the same reference numerals. In FIG. 5, there is a conductive member 23 having the shape of a rod or a cylinder.

The plasma-assisted processing apparatus of the fifth embodiment is provided with a conductive member 23 having the shape of a rod or a cylinder and a height equal to that of a conductive ring 13 at a position corresponding to a central part of the disk antenna. The plasma-assisted processing apparatus of the fifth embodiment is identical in other respects with the plasma-assisted processing apparatus of the first embodiment.

Figure 10:
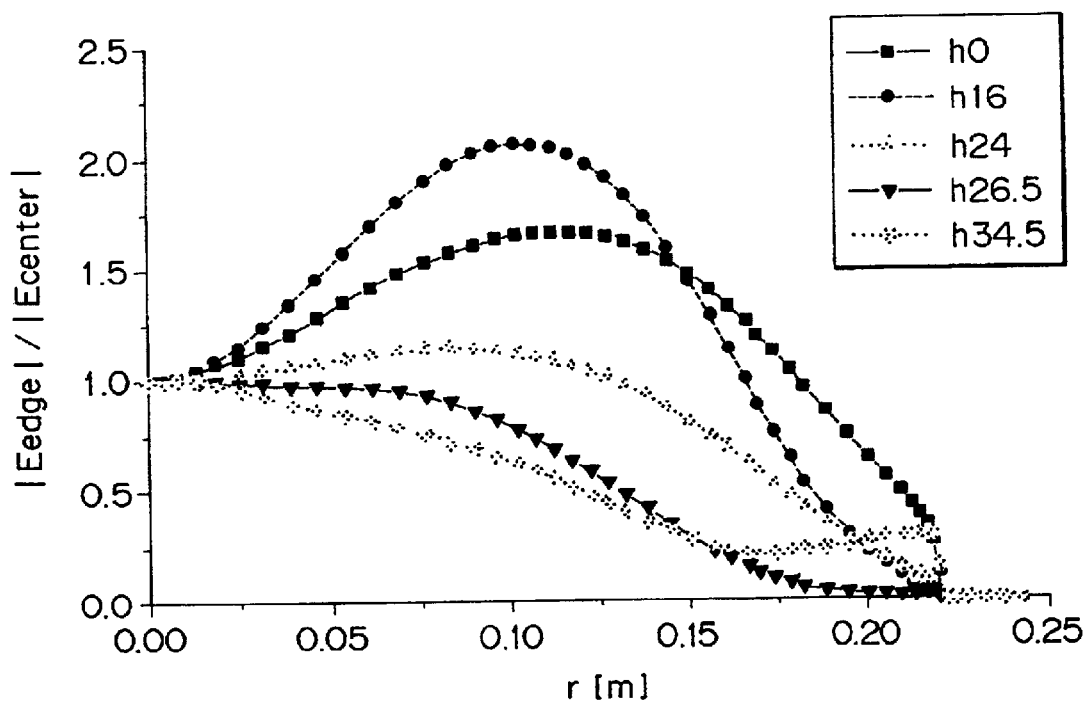
FIG. 10 is a graph showing the electric field strength distribution with respect to a direction along the diameter of the disk antenna of the plasma-assisted processing apparatus representing the fifth embodiment.

FIG. 10 is a graph showing characteristic curves representing electric field strength distributions with respect to a direction along the diameter of the disk antenna 11 for different heights of the conductive member 23.

In FIG. 10, the distance (m) from the center of the disk antenna 11 is measured on the horizontal axis, and the ratio $|E_{edge}|/|E_{center}|$, where $|E_{center}|$ is the electric field strength of a part of an electric field around the central part of the disk antenna 11 and $|E_{edge}|$ is the electric field strength of an optional part of the electric field, is measured on the vertical axis. In FIG. 10, the characteristic curves are for height $h_0=0$, height $h_{16}=16$ mm, height $h_{24}=24$ mm, height $h_{26.5}=26.5$ mm and height $h_{34.5}=34.5$ mm, respectively.

In the plasma-assisted processing apparatus of the fifth embodiment, the conductive member 23 is placed at a position corresponding to the central part of the disk antenna 11 in a space surrounded by the conductive ring 13. The electric field strength distribution is represented by different characteristics curves for different values of the height of the conductive member 23, as shown in FIG. 10. As obvious from FIG. 10, the electric field strength at the center of the disk antenna 11, when the conductive member 23 is used, is higher that when the conductive member 23 is not used, and the electric field strength at the center of the disk antenna 11 increases with an increase in the height of the conductive member 23. For example, when the plasma-assisted processing apparatus is used for a process in which gases which are difficult to dissociate or ionize, such as $BCl_3$, are used and a large amount of reaction products is produced, such as an etching process for etching a metal, the plasma density of a part of a plasma under a central part of the disk antenna 11 decreases and a central part of a workpiece is liable to sink. The processing rate at which the central part of the workpiece is processed can be adjusted and the central part can be properly processed when using the conductive member 23 of an appropriate height selected at the central part of the disk antenna 11 as in the fifth embodiment. The electric field strength of a part of the electric field corresponding to the central part of the disk antenna 11 can be enhanced by using the conductive member 23 extending into a second window 20 or through the second window 20 further into the window 14.

Figure 6:
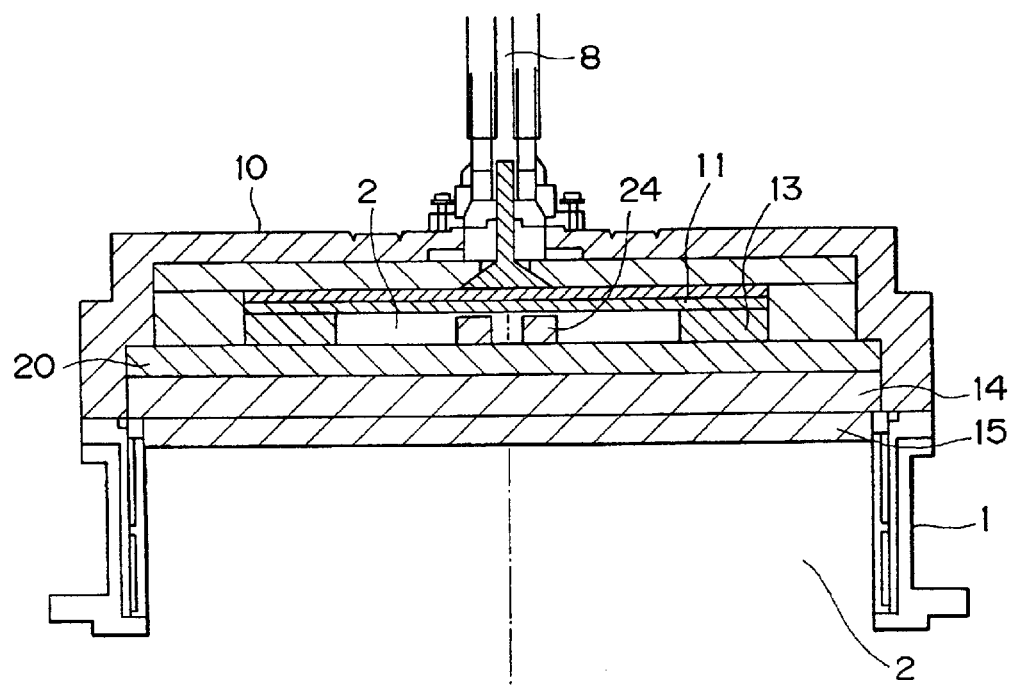
FIG. 6 is a schematic sectional view of a disk antenna and associated parts of a plasma-assisted processing apparatus representing a sixth embodiment according to the present invention.

FIG. 6 is a schematic sectional view of an essential part including a disk antenna 11 of a plasma-assisted processing apparatus according to a sixth embodiment of the present invention, in which parts like or corresponding to those shown in FIG. 2 are denoted by the same reference characters. In FIG. 6, there is a dielectric member 24 having the shape of a ring or a cylinder.

In the plasma-assisted processing apparatus of the sixth embodiment, the space surrounded by a conductive ring 13 is a void and is not filled with the filler 17 used in the second embodiment, and the dielectric member 24 is placed at a position corresponding to a central part of the disk antenna 11 on a second window 20 in the void surrounded by the conductive ring 13. The plasma-assisted processing apparatus of the sixth embodiment is identical in other respects with the plasma-assisted processing apparatus of the second embodiment.

The plasma-assisted processing apparatus of the sixth embodiment is provided with a dielectric member 24 having the shape of a ring or a cylinder and disposed at a position corresponding to a central part of the disk antenna 11 on the second window 20 in the void surrounded by the conductive ring 13. Although it is desirable that the dielectric member 24 has a large height, the dielectric member 24 does not need to be so high as to be in contact with the disk antenna 11.

The radius $d_s$ of the dielectric member 24 having the shape of a ring or a cylinder may be about equal to half a position corresponding to a peak of the diametrical electric field component $E_r$ of a high-frequency wave, i.e., about equal to half a quarter of the wavelength of the high-frequency wave in a sheath region 2'. More specifically, the approximate value of the radius $d_s$ may be calculated by:

$$d_s = \in_s^{1/2}/(1+\in_s^{1/2})\lambda_0/4/2$$

where $\lambda_0$ is the wavelength of the high-frequency wave in a vacuum, and $\in_s$ is the dielectric constant of the material of the window 14. A part of the electric field strength distribution corresponding to a central part of the disk antenna 11 can be effectively prevented from sinking when the dielectric member 24 has the shape of a ring. Desirably, the dielectric constant of the material of the dielectric member 24 is greater than that of the material of the window 14. When the frequency of the high-frequency wave used is 450 MHz and the window 14 is formed of quartz having a dielectric constant $\in=3.5$, alumina is a material suitable for forming the dielectric member 24, and the radius $d_s$ may be about 54 mm.

Figure 7:
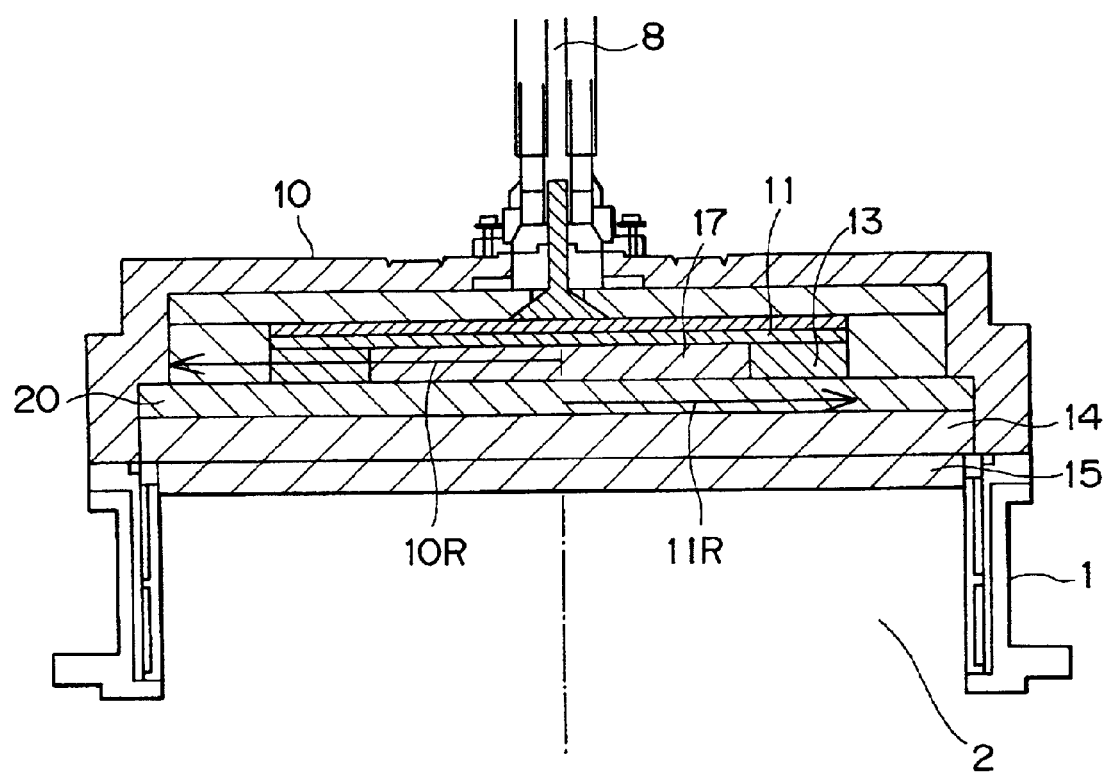
FIG. 7 is a schematic sectional view of a disk antenna and associated parts of a plasma-assisted processing apparatus representing a seventh embodiment according to the present invention.

FIG. 7 is a schematic sectional view of a part, including a disk antenna 11, of a plasma-assisted processing apparatus according to a seventh embodiment of the present invention, in which parts like or corresponding to those shown in FIG. 2 are denoted by the same reference numerals. In FIG. 7, 10R denotes the inside radius (radius of a waveguide) of a shield 10, and 11R denotes the radius of the disk antenna 11.

The radius 11R=a of the disk antenna 11, the inside radius 10R=b of the shield 10 are selectively determined so that the ratio γ=a/c is 0.4 or below or 0.6 or above, where c is the effective diameter of a waveguide expressed by:

$c=\{a+\in_s^{1/2}(b-a)\}$, where $\in s$ is the dielectric constant of a dielectric material filling the space between the disk antenna 11 and the side wall of the shield 10.

Figure 11:
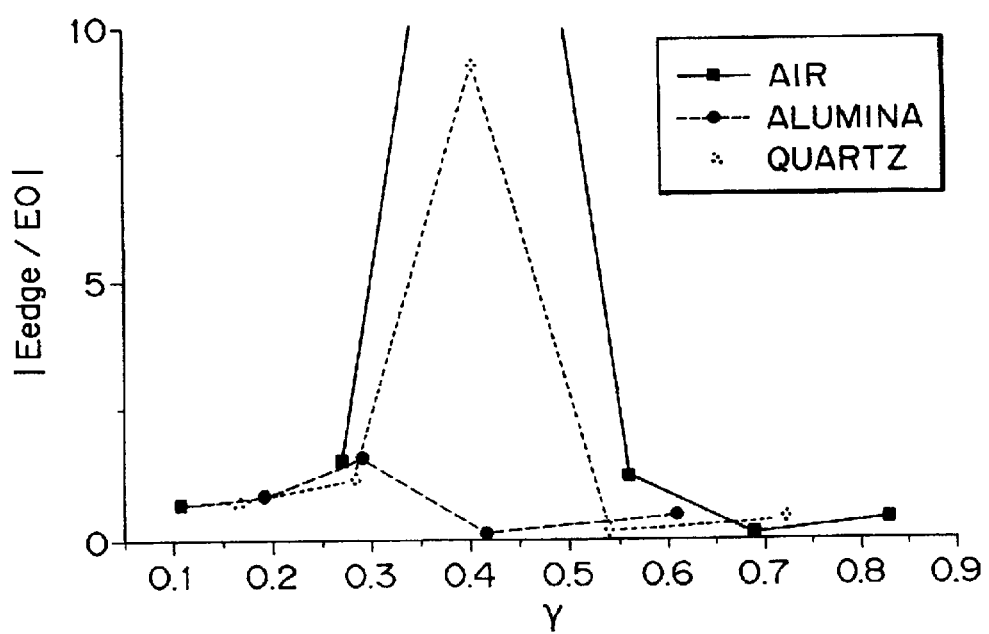
FIG. 11 is a graph showing the variation of the strength of a high-frequency electric field when the ratio of the radius of the disk antenna to the effective diameter of a waveguide included in the plasma-assisted processing apparatus representing the seventh embodiment is changed.

FIG. 11 is a graph showing characteristic curves representing the variation of high-frequency electric fields with the ratio γ=1/c for materials filling the space between the disk antenna 11 and the side wall of the shield 10.

In FIG. 11, the ratio γ is measured on the horizontal axis, and the ratio $|E_{edge}|/|E_{center}|$, where $|E_{center}|$ is the electric field strength of a part of an electric field around the central part of the disk antenna 11 and $|E_{edge}|$ is the electric field strength of an optional part of the electric field, is measured on the vertical axis. In FIG. 11, characteristic curves represent the variation of the ratios $|E_{edge}|/|E_{center}|$ for air, alumina and quartz used as the dielectric material filling up the space between the side wall of the shield 10 and the disk antenna 11.

Description will be given, in connection with the graph shown in FIG. 11, of the effect of the ratio γ=a/c (a is the radius of the disk antenna 11, and c is the effective diameter of the waveguide) concerning the determination of the high-frequency electric field strength distribution, and on the determination of the plasma density distribution as well.

The electric field strength in a space around the disk antenna 11 changes when the radius a of the disk antenna 11 is changed. As shown in FIG. 11, in which the ratio γ=a/c is measured on the horizontal axis, and the ratio $|E_{edge}|/|(E_{center}|$, is measured on the vertical axis, the electric field strength distribution curves for the different dielectric materials respectively having different dielectric constants, and which fill up the space between the shield 10 and the disk antenna 11, are substantially similar. The electric field strength is low in a range where γ≦0.4 and a range where γ≧0.6. When the diameter of the waveguide is 220 mm, a desirable radius a of the disk antenna 11 is 88 mm or below, or 132 mm or above. Suppose that the ratio γ* (radius of the antenna)/(effective diameter of the waveguide) is defined by: γ*=γ*(f/f_0), where $f_0$ is a reference frequency. In this case the reference frequency is 450 MHz. Then, a range for an index equal to the aforesaid range applies to the ratio between peripheral electric field strength and the central electric field strength. The diameter of the processing chamber may be used instead of the effective diameter b of the waveguide.

Thus, the reduction of the electric field strength in the periphery of the disk antenna 11 causes the reduction of the plasma density in the periphery of the disk antenna 11, which suppresses the change of the electric field strength distribution in the electric field created by the high-frequency wave having a frequency in the UHF or the VHF band resulting from a change in the high-frequency power, the pressure of gases or the types of the gases. Consequently, a stable plasma can be produced always even if the high-frequency power, the pressure of gases and/or the types of gases are changed.

The plasma-assisted processing apparatuses which form the first to the seventh embodiments enhance the electric field strength of an electric field corresponding to a region in which the workpiece 4 is placed, for the high-frequency electric field strength in the UHF or the VHF band, create an electric field having a desired electric field strength distribution, such as a flat distribution or a distribution having a slightly sinking middle part, reduce the propagation of the high-frequency wave through the peripheral part of the disk antenna 11, and change the effective dielectric constant as judged from the side of the plasma by changing the effective distance between the disk antenna 11 and the window 14 by the antenna height adjusting members 22, by selectively determining the radius a of the disk antenna 11, disposing the conductive ring 13 under the peripheral part of the disk antenna 11, and disposing the second window 20 or forming the void between the conductive ring 13 and the window 14 to create a high-frequency electric field of a desired electric field strength distribution proper for the types of gases to be used.

As apparent from the foregoing description, according to the present invention, the conductive ring is disposed with its end surface in contact with the disk antenna to generate a high-frequency standing wave in the space surrounded by the conductive ring. Therefore, the electric field strength in the space in which the standing wave is generated is increased, and the electric field strength in the peripheral region is reduced relatively. Thus, the variation of the power absorbed by the plasma, i.e., the variation of the plasma density distribution, can be suppressed even if the high-frequency power (density), the pressure and the type of gases are changed; and, consequently, a highly uniform plasma can be produced for process parameters which are subject to change in wide ranges.

What is claimed is:

1. A plasma-assisted processing apparatus comprising:

a vacuum vessel defining a processing chamber;

a gas supply line for carrying gases into the processing chamber;

a workpiece support for supporting a workpiece, disposed in the processing chamber and serving as an electrode;

a disk antenna for radiating a high-frequency wave of a frequency in the VHF or the UHF band into the processing chamber;

a high-frequency waveguide for guiding a high-frequency wave to the disk antenna; and a window of a dielectric material isolating the disk antenna from the processing chamber;

wherein a conductive ring is disposed between the disk antenna and the window such that its end surface is in contact with a peripheral part of the disk antenna; and wherein a conductive member having the shape of a rod or a cylinder of a height equal to that of the conductive ring is disposed in a central region of a space surrounded by the conductive ring and corresponding to a central part of the disk antenna.

2. A plasma-assisted processing apparatus comprising:

a vacuum vessel defining a processing chamber;

a gas supply line for carrying gases into the processing chamber;

a workpiece support for supporting a workpiece, disposed in the processing chamber and serving as an electrode;

a disk antenna for radiating a high-frequency wave of a frequency in the VHF or the UHF band into the processing chamber;

a high-frequency waveguide for guiding a high-frequency wave to the disk antenna; and a window of a dielectric material isolating the disk antenna from the processing chamber;

wherein a conductive ring is disposed between the disk antenna and the window such that its end surface is in contact with a peripheral part of the disk antenna;

wherein a second window of a dielectric material is superposed on the window, and the window and the second window are formed of different dielectric materials respectively having different dielectric constants, respectively; and wherein a conductive member having the shape of a rod or a cylinder of a height equal to that of the conductive ring is disposed in a central region of a space surrounded by the conductive ring and corresponding to a central part of the disk antenna.

* * * * *